United States Patent [19]

Eshima et al.

[11] Patent Number: 4,923,386
[45] Date of Patent: May 8, 1990

[54] APPARATUS FOR FORMING LEADS OF A SEMICONDUCTOR DEVICE

[75] Inventors: Taizo Eshima; Yasuyoshi Kai, both of Fukuoka, Japan

[73] Assignee: Mitsubishi Denki Kabushiki Kaisha, Japan

[21] Appl. No.: 279,800

[22] Filed: Dec. 5, 1988

[30] Foreign Application Priority Data

Dec. 17, 1987 [JP] Japan ................. 62-322122

[51] Int. Cl.⁵ .......... B28B 3/00; B29C 33/20
[52] U.S. Cl. .................. 425/450.1; 100/282; 100/292; 100/257; 83/530; 83/527; 83/632; 83/626; 83/283; 72/450
[58] Field of Search ............ 83/530, 527, 632, 626, 83/283; 74/44; 72/450; 100/282, 292, 257; 425/450.1

[56] References Cited

U.S. PATENT DOCUMENTS

| | | | |
|---|---|---|---|
| 2,869,453 | 1/1959 | Horn | 100/282 |
| 4,480,538 | 11/1984 | Yoshida | 100/282 |
| 4,677,908 | 7/1987 | Imanishi et al. | 100/257 |

FOREIGN PATENT DOCUMENTS 56-150835 11/1981 Japan .

OTHER PUBLICATIONS

"Press Manufacturing Handbook", by the Japan Plastic Manufacturing Association, published by Maruzen Ltd., pp. 772-775.

Primary Examiner—Frank T. Yost
Assistant Examiner—Hwei-Siu Payer
Attorney, Agent, or Firm—Leydig, Voit & Mayer

[57] ABSTRACT

A lead forming apparatus suitable for use in forming the leads of a semiconductor device is disclosed. The apparatus has a housing for supporting a stationary lower mold half, a support plate arranged to freely move with respect to the housing for supporting a movable mold half in opposition to the lower mold half, a moving device for moving the support plate to cause the movable mold half toward and away from the lower mold half, and an adjusting device for adjusting the position of the support plate with respect to the moving device. The moving device has a crankshaft, a driving device for rotating the crankshaft about its axis, and a coupler transmitting the rotation of the crankshaft to the support plate as a linear motion. The apparatus having the above-described arrangement can be operated with a reduced noise level and a reduced impact and, furthermore, achieves good operability.

4 Claims, 6 Drawing Sheets

APPARATUS FOR FORMING LEADS OF A SEMICONDUCTOR DEVICE

BACKGROUND OF THE INVENTION

1. Field of the Invention

This invention relates to an apparatus for forming the external leads of a semiconductor device.

2. Description of the Related Art

FIG. 1 shows a conventional type of lead forming apparatus. A hydraulic cylinder 104 is secured to the top of a housing 105 and a piston rod 103 of the hydraulic cylinder 104 is inserted through the housing 105. An upper plate 101a is fixed to the inserted end of the piston rod 103. A lower plate 102a is secured to a partitioning plate 106 which partitions the interior of the housing 105 into upper and lower compartments. An upper mold half 101, such as a punch, and a lower mold half 102, such as a die, are attached to the upper plate 101a and the lower plate 102a, respectively, opposed to each other. An upper stop 107 and a lower stop 108 are attached to the upper plate 101a at a location adjacent to the upper mold half 101 and the lower plate 102a at a location adjacent to the lower mold half 102, respectively, opposed to each other. A hydraulic unit 109 is disposed at the bottom of the housing 105 and is connected to the hydraulic cylinder 104 through hydraulic lines 110.

The operation of the above-described conventional lead forming apparatus will be described below. First, a leadframe (not shown) is located on the lower mold half 102. A semiconductor chip has been mounted on this leadframe, and the semiconductor chip and a portion of the leadframe have been encapsulated in a resin. Then, fluid is supplied from the hydraulic unit 109 to the hydraulic cylinder 104 through the lines 110, thereby causing the piston rod 103 with the upper mold half 101 to move downwardly. The downward movement of the upper mold half 101 severs a predetermined portion of the leadframe carried on the lower mold half 102, and thus the external leads of the semiconductor device are formed. The downward movement of the piston rod 103 is stopped when the upper stop 107 attached to the upper plate 101a comes into contact with the lower stop 108 attached to the lower plate 102a. More specifically, the bottom dead center of the piston rod 103 is determined by the upper stop 107 and the lower stop 108. Subsequently, the piston rod 103 is moved upwardly by the hydraulic unit 109 so that the upper mold half 101 is moved away from the lower mold half 102 and the semiconductor device finished as a product is removed from the lower mold half 102.

In such a conventional lead forming apparatus, however, since the downward movement of the piston rod 103 and the upper mold half 101 is stopped by pressing the upper stop 107 against the lower stop 108, a large impact occurs during the operation of the lead forming apparatus and, therefore, noise cannot be avoided.

If it is desired to form the external leads of semiconductor devices of different types, both the upper mold half 101 and the lower mold half 102 need to be replaced with mold halves suitable for use in forming the individual types of semiconductor devices. Upon replacement, the bottom dead center of the piston rod 103 must be adjusted according to the height of each of the upper and lower mold halves 101 and 102 which have been newly set on the lead forming apparatus. However, since adjustment of the bottom dead center of the piston rod 103 is carried out by replacing at least one of the upper and lower stops 107 and 108 with another stop of different height, much time is required to adjust it and precise adjustment is difficult to achieve.

SUMMARY OF THE INVENTION

It is an object of this invention to provide a lead forming apparatus for semiconductor devices which can be operated with a reduced noise level and a reduced impact and which has good operability, so that the above-described problems can be solved.

To achieve the above and other objects, in accordance with the present invention, there is provided an apparatus for forming the leads of a semiconductor device which includes a first mold half supporting means for supporting a first mold half, a second mold half supporting means arranged to freely move with respect to the first mold half supporting means for supporting a second mold half in opposed relationship to the first mold half, moving means for moving the second mold half supporting means toward and away from the first mold half, and adjusting means for adjusting the position of the second mold half supporting means with respect to the moving means.

The above and other objects, features and advantages of this invention will become apparent from the following description of the preferred embodiments thereof, taken in conjunction with the accompanying drawings.

DESCRIPTION OF THE PREFERRED EMBODIMENTS

Preferred embodiments of this invention will be described hereinbelow with reference to the accompanying drawings.

An apparatus for forming the leads of a semiconductor device according to a first embodiment of this invention will be described below with reference to FIGS. 2 to 10.

Figure 1:
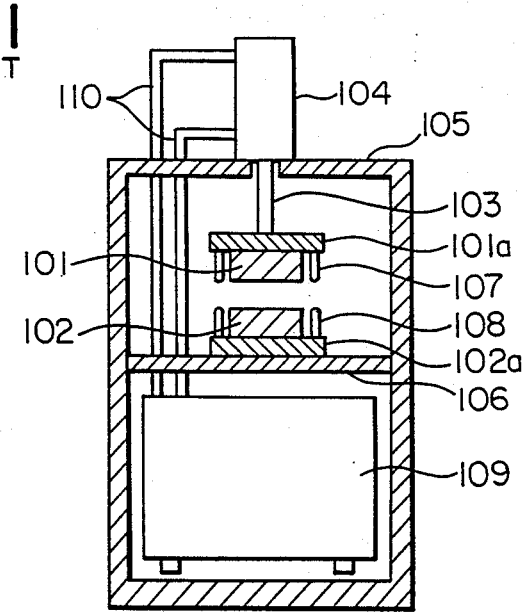
FIG. 1 is a diagrammatic cross-sectional view showing a conventional apparatus for forming the leads of a semiconductor device.
Figure 2:
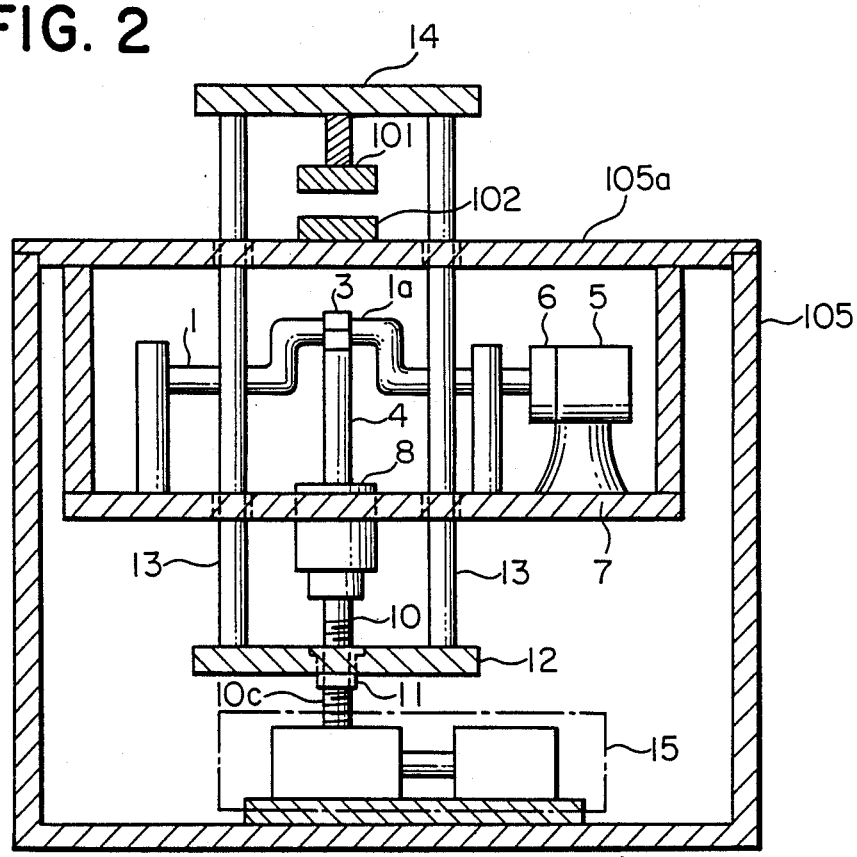
FIG. 2 is a diagrammatic cross-sectional view showing an apparatus for forming the leads of a semiconductor device according to one embodiment of this invention.

Referring to FIG. 2, the illustrated apparatus has a housing 105 which serves as a first mold half supporting means. A lower mold half 102 which serves as a first mold half is attached to a lower mold half supporting plate or top plate 105a of the housing 105. A servo-motor supporting plate 7 is disposed in the housing 105 and fixedly suspended from the top plate 105a in a parallel relation therewith. A servo motor 5 is mounted on the servo-motor supporting plate 7. A crankshaft 1 is coupled to the servo motor 5 through a reduction worm gear 6, and one end 3 of a first coupling rod 4 is rotatably coupled to an eccentric portion 1a of the crankshaft 1. A pivot coupler 8 is fixed to the center of the servo-motor supporting plate 7 extending vertically through the supporting plate 7. A second coupling rod 10 such as a screw shaft is supported by the pivot coupler 8 rotatably about its axis and slidably along its axis and extends downwardly from the pivot coupler 8. The other end of the first coupling rod 4 is pivotally supported on one end of the second coupling rod 10 in the pivot coupler 8. An external thread is formed around the outer periphery of a middle portion 10c of the second coupling rod 10. A movable plate 12 is disposed parallel to the servo-motor supporting plate 7 at a location therebelow in the housing 105, and a screw holder nut 11, which extends through and is fixed to the center of the movable plate 12, threadedly engaged the external thread of the second coupling rod 10. A plurality of vertical posts 13 are fixed to the movable plate 12 perpendicular to the plane of the movable plate 12. Each of the posts 13 extends through the servo-motor supporting plate 7 and the top plate 105a of the housing 105 for vertical sliding movement relative thereto. An upper plate 14, which is located parallel to the movable plate 12, is fixed to the upper ends of the respective posts 13 which extend above the housing 105. An upper mold half 101 which serves as a second mold half is attached to the lower surface of the upper plate 14 in opposed relationship to the lower mold half 102 provided on the top plate 105a of the housing 105.

An adjusting device 15 is disposed at the bottom of the housing 105 for adjusting the height of the movable plate 12 by rotating the second coupling rod 10 about its axis.

Figure 3:
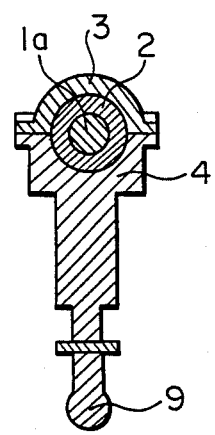
FIG. 3 is a longitudinal sectional view showing a first coupling rod 4 incorporated in the apparatus of FIG. 2.
Figure 4:
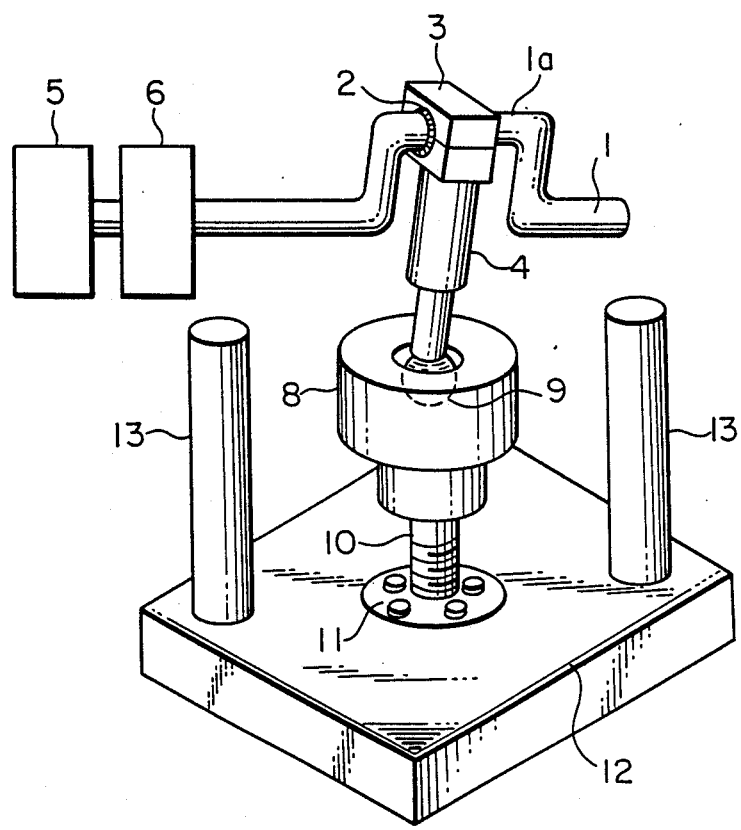
FIG. 4 is a perspective view diagrammatically showing a moving means incorporated in the apparatus of FIG. 2.

As shown in FIGS. 3 and 4, a metallic sleeve 2 surrounds the outer periphery of the eccentric portion 1a of the crankshaft 1, and the sleeve 2 is received in and fixed to a housing which is formed at the end 3 of the first coupling rod 4. A ball 9 is formed at the other end of the first coupling rod 4. The ball 9 is supported in the pivot coupler 8.

Figure 5:
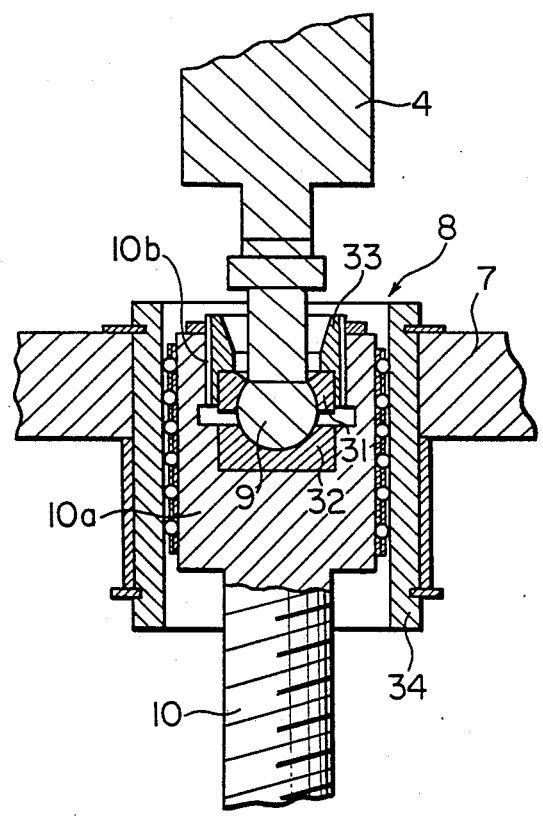
FIG. 5 is a sectional view showing a pivot section 8 incorporated in the apparatus of FIG. 2.
Figure 6:
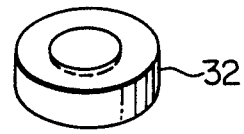
FIGS. 6 and 7 are perspective views respectively showing parts 32 and 31 used in the pivot section 8 of FIG. 5.
Figure 7:

The pivot coupler 8, as shown in FIG. 5, has a cylindrically-shaped stroke ball bearing 34 which is extended through and fixed to the servo-motor supporting plate 7. One end 10a of the second coupling rod 10 is held in the stroke ball bearing 34. A recess 10b opening upward is formed in the end 10a of the second coupling rod 10, and a lower metallic member 32 having a hemispherical recess such as that shown in FIG. 6 is buried in the recess 10b. The lower portion of the ball 9 which is formed at the other end of the first coupling rod 4 is snugly fitted in the semispherical recess in the upper surface of the lower metallic member 32, and the upper side portion of the ball 9 is covered by an upper annular metallic member 31 such as that shown in FIG. 7. Furthermore, the upper annular metallic member 31 is held by a holder 33 which is screwed into the recess 10b of the second coupling rod 10. Thus, the second coupling rod 10 is supported rotatably about its axis and slidably along its axis, while the other end of the first coupling rod 4 is pivotally supported by the end 10a of the second coupling rod 10.

Figure 8:
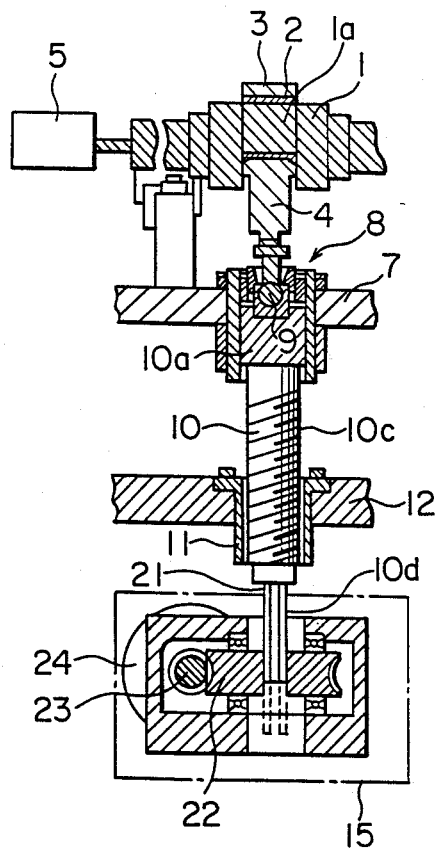
FIG. 8 is a sectional view showing a moving means and an adjusting means which may be incorporated in the apparatus of FIG. 2.
Figure 9:
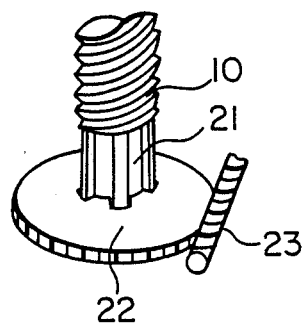
FIGS. 9 and 10 are a perspective view and a top plan view respectively showing portions of the adjusting means of FIG. 8.
Figure 10:
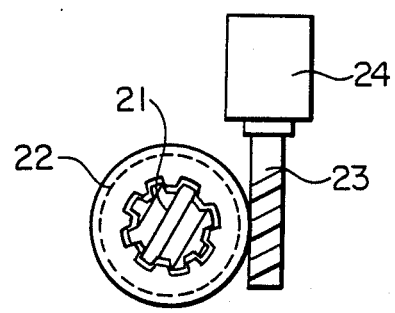

As shown in FIG. 8, the second coupling rod 10 has one end 10a supported by the pivot coupler 8, the middle portion 10c having an outer periphery that is externally threaded, and a second end portion 10d formed as a spline shaft 21. Thus, the spline shaft 21 is located in the adjusting device 15. The adjusting device 15, as shown in FIGS. 9 and 10, is provided with a worm gear 22 which is engaged with the spline shaft 21 slidably along the axis thereof. A worm shaft 23 which is engaged with the worm gear 22 is coupled to a stepping motor 24. In this manner, the rotational force of the stepping motor 24 is transmitted to the spline shaft 21 of the second coupling rod 10 through the worm shaft 23 and the worm gear 22 so that the second coupling rod 10 is rotated about its axis.

Next, the operation of the above-described embodiment will be described below.

Referring back to FIG. 2, a leadframe (not shown) is located on the lower mold half 102. A semiconductor chip has been mounted on this leadframe, and the semiconductor chip and a portion of the leadframe. Then, the servo motor 5 is activated to rotate the crankshaft 1 through the reduction gear 6. Thus, the first coupling rod 4 whose end 3 is rotatably connected to the eccentric portion 1a of the crankshaft shaft 1 makes a swinging motion. During this time, the second coupling rod 10 moves up and down without rolling in the horizontal direction, while being guided by the stroke ball bearing 34, since the ball 9 which is formed at the other end of the first coupling rod 4 is, as shown in FIG. 5, held by the upper metallic member 31 and the lower metallic member 32 in the recess 10b at the end 10a of the second coupling rod 10.

Thus, the movable plate 12 which is coupled to the middle portion 10c of the second coupling rod 10 by means of the screw holder nut 11 moves up and down and, furthermore, the upper plate 14 which is connected to the movable plate 12 with the posts 13 and the upper mold half 101 which is attached to the upper plate 14 move up and down. During this time, the upper mold half 101 reciprocates with a stroke whose length is double the amount of eccentricity of the crankshaft 1.

Thus, a predetermined portion of the leadframe located on the lower mold half 102 is severed by the upper mold half 101 which has moved to its lowest point, that is, its bottom dead center, and the external leads of the semiconductor device are formed. Subsequently, as the crankshaft 1 further rotates, the upper mold half 101 moves up. After the upper mold half 101 has reached its highest point, that is, its top dead center, the semiconductor device finished as a product is removed from the lower mold half 102.

If it is desired to form the external leads of a semiconductor device of a different type, the upper mold half 101 and the lower mold half 102 are replaced with mold halves suitable for use in forming the type of semiconductor device to be processed. Adjustment of the bottom dead center of the upper mold half 101 is carried out by driving the stepping motor 24 shown in FIG. 8. When the stepping motor 24 is driven, the spline shaft 21 is rotated by means of the worm shaft 23 and the worm gear 22 and thus the second coupling rod 10 is rotated. During this rotation, as shown in FIG. 5, the ball 9 of the first coupling rod 4 remains stationary in the end 10a of the second coupling rod 10, while the end 10a of the second coupling rod 10 rotates within the stroke ball bearing 34, together with the upper metallic member 31, the lower metallic member 32 and the holder 33.

When the second coupling rod 10 rotates in this manner, the screw holder nut 11 which is, as shown in FIG. 8, screwed onto the external thread formed around the middle portion 10c of the second coupling rod 10 moves upwardly or downwardly depending upon the direction of rotation of the second coupling rod 10. In consequence, as shown in FIG. 2, the movable plate 12 to which the screw holder nut 11 is fixed, the posts 13, the upper plate 14 and the upper mold half 101 move upwardly or downwardly, together with the screw holder nut 11. In this fashion, adjustment of the bottom dead center of the upper mold half 101 is completed.

The accuracy of adjustment of the bottom dead center is given by $$\delta = (l/i)\cdot(\theta/2\pi)$$

where $\delta$ is the accuracy of adjustment of the bottom dead center, $\theta$ is the step angle of the stepping motor 24, i is the reduction ratio of the worm gear 22 to the worm shaft 23, and l is the lead of the external thread of the middle portion 10c of the second coupling rod 10. For instance, if l=8 mm, i=20 and $\theta=0.72°$, the accuracy $\delta$ is $$\begin{aligned}\delta &= (8/20)\cdot(0.72/360)\\ &= 8\times 10^{-4}\text{ mm}\\ &= 0.8\ \mu\text{m}\end{aligned}$$

Therefore, it is found that the high-accuracy adjustment of the bottom dead center is possible.

Figure 11:
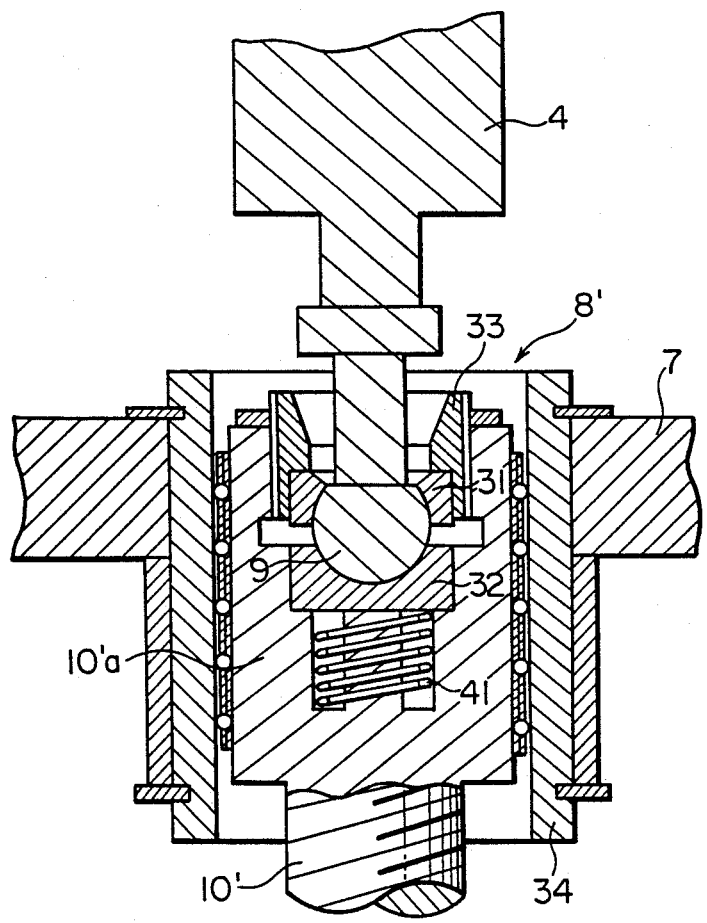
FIG. 11 is a sectional view showing a pivot section according to another embodiment of this invention.

It is to be noted that, as shown in FIG. 11, a wear adjusting means 41 in the form of a coiled compression spring may be disposed immediately below the lower metallic member 32 in the end 10a' of the second coupling rod 10' for applying a constant upward pressure to the lower metallic member 32 and the ball 9. Due to the action of this spring 41, it is possible to prevent any play from occurring in the pivot section 8' owing to the wear of, for example, the ball 9, the upper metallic member 31, or the lower metallic member 32. An elastic member such as rubber may be used in place of the wear adjusting spring 41.

Figure 12:
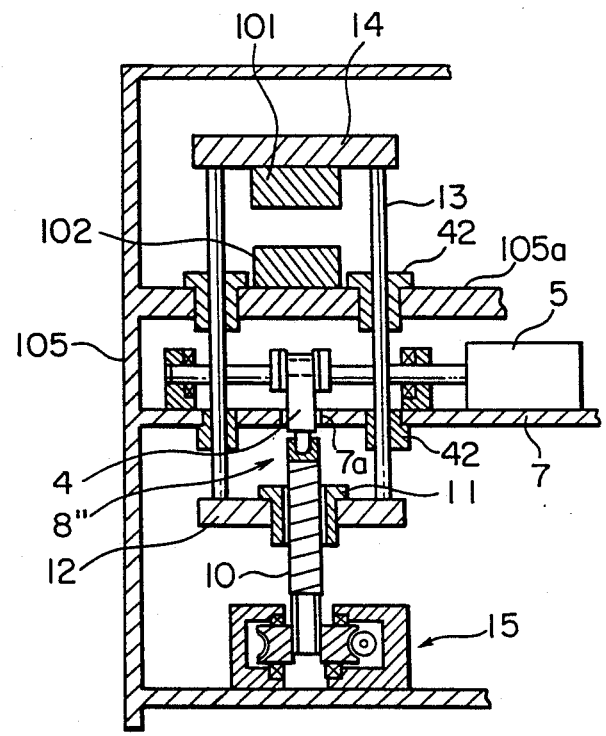
FIG. 12 is a diagrammatic cross-sectional view showing an apparatus for forming the leads of a semiconductor device according to still another embodiment of this invention.

In addition, as shown in FIG. 12, a slide bearing 42 may be provided in each through-hole formed in the servo-motor supporting plate 7 and the lower mold half supporting plate 105a of the housing 105 and the respective posts 13 may be inserted through the corresponding slide bearings 42. With this arrangement, the posts 13 can be slidably supported for vertical movement along their axes by the slide bearings 42. In this case, even if the stroke ball bearing 34 of the previous embodiment for supporting the end 10a of the second coupling rod 10 is not employed, the second coupling rod 10, the upper mold half 101 and so forth are capable of moving up and down without any radial play. Accordingly, a through-hole 7a into which the first coupling rod 4 is loosely fitted is formed in the servo-motor supporting plate 7 so that the first coupling rod 4 is pivotable around the pivot connection 8".

It is to be noted that, if a reduction gear whose reduction ratio can be freely adjusted is employed as the reduction worm gear 6, it is possible to provide a lead forming apparatus having further improved operability. A speed reducer using a belt may be employed in place of the reduction worm gear 6.

Furthermore, AC motors of the inverter-driven type may be used in place of the servo motor 5 and the stepping motor 24.

What is claimed is:

1. An apparatus for forming leads of a semiconductor device comprising:
   first mold half supporting means for supporting a first mold half;
   second mold half supporting means movable relative to said first mold half supporting means for supporting a second mold half opposite said first mold half;
   means for reciprocally moving said second mold half supporting means toward and away from said first mold half supporting means including:
   a crankshaft having an axis;
   means for rotating said crankshaft about its axis;
   a first coupling rod having opposed first and second ends and rotatably engaging the crankshaft at the first end;
   a coupler pivotally engaging the first coupling rod at its second end;
   a second coupling rod having opposed first and second ends and external threads between the first and second ends, the external threads threadedly engaging the second mold half supporting means and the first end of said second coupling rod rotatably engaging said coupler; and
   means for rotating said second coupling rod engaging said second coupling rod at its second end for adjusting the engagement of said second coupling rod with said second mold half supporting means along said second coupling rod whereby the minimum spacing between said first mold half supporting means and said second mold half supporting means is adjusted.

2. The apparatus according to claim 1 wherein said means for rotating said crankshaft comprises a servo motor and a speed reducer interconnecting said servo motor to said crankshaft for driving said crankshaft, said speed reducer for adjusting the rotational speed of said crankshaft.

3. The apparatus according to claim 1 wherein said second end of said second coupling rod includes a spline and said means for rotating said second coupling rod includes a gear slidably engaging said spline and means for rotating said gear.

4. The apparatus according to claim 3 wherein said means for rotating said gear comprises a stepping motor.

* * * * *